United States Patent
Hull et al.

[11] Patent Number: 5,703,809
[45] Date of Patent: Dec. 30, 1997

[54] OVERCHARGE/DISCHARGE VOLTAGE REGULATOR FOR EPROM MEMORY ARRAY

[75] Inventors: Richard Hull, Chandler; Randy L. Yach, Phoenix, both of Ariz.

[73] Assignee: Microchip Technology Incorporated, Chandler, Ariz.

[21] Appl. No.: 723,926

[22] Filed: Oct. 1, 1996

[51] Int. Cl.[6] ............................................. G11C 16/00
[52] U.S. Cl. ................................. 365/185.25; 365/20 W
[58] Field of Search ........................... 365/185.25, 204, 365/185.04, 185.18, 185.21, 189.01

[56] References Cited

U.S. PATENT DOCUMENTS

| | | | |
|---|---|---|---|
| 4,334,292 | 6/1982 | Kotecha | 365/185.25 |
| 5,138,575 | 8/1992 | Ema et al. | 365/185.25 |
| 5,270,978 | 12/1993 | Matsumoto et al. | 365/185.25 |

*Primary Examiner*—Tan T. Nguyen
*Attorney, Agent, or Firm*—Wigman, Cohen, Leitner & Myers, P.C.

[57] ABSTRACT

A method of high speed reading of data from an EPROM, in which a memory array is programmed based on device status at intersections of rows and columns of the array to store data therein as 0's and 1's, uses a capacitive overcharging and discharging technique to enable fast voltage stabilization without drawing significant current. A row containing the memory element to be read is quickly overdriven to overcharge an effective capacitance associated with the row to substantially the maximum level of the EPROM supply voltage which may exceed the programmed threshold voltage of the selected memory element. The effective capacitance is thereupon discharged to a predetermined voltage level below both the maximum level of the supply voltage and the programmed threshold. Then the status and data content of the selected memory element are read by first grounding an electrode of a source-drain path of a transistor comprising the memory element to cause current with substantially no DC component to flow through that path of the transistor. A sense amplifier in the source-drain path of the transistor is triggered to detect current flow therethrough as indicative of the data content of the memory element.

9 Claims, 2 Drawing Sheets

OVERCHARGE/DISCHARGE VOLTAGE REGULATOR FOR EPROM MEMORY ARRAY

CROSS-REFERENCE TO RELATED APPLICATIONS

This application is related to co-pending applications titled "Switched Ground Read for EPROM Memory Array" (Attorney's Docket No. 1305.086), "Voltage Reference Generator for EPROM Memory Array" (Attorney's Docket No. 1305.087), and "High Voltage Level Shifting CMOS Buffer" (Attorney's Docket No. 1305.089), filed on the same day and assigned to the same assignee as this application, and the disclosures of which are incorporated herein by reference.

BACKGROUND OF THE INVENTION

The present invention relates generally to read-only memory devices and memory arrays, and to improved techniques and devices for reading data from such devices and arrays, and more particularly to improved structures and methods for reading data from erasable programmable read-only memory (EPROM) devices.

EPROM devices are fabricated using semiconductor process technology. As line widths are reduced in progression of the process technology it may be desirable not only to design and fabricate entirely new versions of products but to "shrink" or scale existing products to a smaller size with the new technology. This requires review and analysis of the design and architecture of the product and the manner in which the attempted scaling of its size may adversely affect its operation. The present invention arose from the task to shrink EPROM products according to a new process technology, in a cost-effective and operation-feasible manner.

In undertaking such a task for an EPROM program memory embedded in a microcontroller, for example, the scaling process imposes restrictions which, when coupled with the device requirements, makes the task extremely difficult. Some of the issues encountered in implementing a scaling process for such a device are wide voltage range, low program read margins, high speed, and low current. In particular, the read margins of the scaled EPROM are typically lower than the operating voltage range of the device.

In a classic implementation of an EPROM array embedded in a microcontroller, the supply voltage of the microcontroller is used to control the EPROM memory element so as to enable reading of the data stored in the element. To read the data, a measurement of the programmed threshold voltage of the memory element is required. The memory element is said to be erased if the threshold voltage of the EPROM cell is low, and to be programmed if the threshold voltage is high. The cell is read by applying a voltage to the control gate of a transistor comprising the cell. If the applied voltage is higher than the threshold, current flows through the cell. The programming margin of the cell is the voltage difference between the maximum applied control gate voltage and the programmed threshold voltage of the programmed cell. A programmed EPROM cell will not conduct current when read by application of a control gate voltage of lower magnitude than the high threshold voltage of the cell.

In most implementations, the control gate Voltage used to read the memory array is the supply voltage of the system. If the programmed threshold of the memory cell is lower than the maximum value of that supply voltage, a programmed cell cannot be detected using the classic techniques.

Scaling the device to smaller size also has the effect of reducing the voltage range which is used to operate the EPROM. When an EPROM memory cell is shrunk, the programmed threshold voltage is decreased and the effective programming margin is lowered. Also, a smaller EPROM cell typically dictates a lower read current. All of this makes it difficult to read the data in a scaled EPROM cell by means of standard techniques.

Lowering the read margin voltage below the supply voltage requires that the row voltage (i.e., the voltage that controls the gate of the EPROM memory element) be regulated to a lower value. If the control gate voltage is not reduced to a level below the magnitude of the programmed threshold voltage, the contents of the EPROM memory cell cannot be read. Regulating the read voltage usually requires the consumption of significant amounts of current, especially if the electrical node being driven requires high speed operation or is heavily loaded with capacitance.

A typical solution to regulate the row voltage would be to clamp the row voltage by bleeding off current proportional to the supply voltage to limit the final voltage that is applied to the EPROM element. In the classic EPROM read architecture, the row drive circuitry is also required to be high speed and has a significant amount of capacitive loading. This makes the job of regulating the final voltage very difficult when given the constraints of low current consumption and high speed operation.

It is a principal aim of the present invention to implement a high speed, low power EPROM array in a scaled process technology in which the programmed threshold of the EPROM cell may be less than the device supply voltage. More particularly it is an object of the invention to implement such an EPROM array by regulating the final voltage in an effective manner despite the difficulties and constraints described above.

SUMMARY OF THE INVENTION

Briefly stated, the present invention utilizes a technique that provides a solution to the problem of implementing a high speed, low power EPROM array in a scaled process technology where the programming threshold voltage is below the operating supply voltage of the microcontroller. Further, this solution is achieved while yielding a current consumption which is consistent with that of a classic implementation having programming margins above the product operating voltage.

According to the invention, the control gate voltage is first driven to the level of the system supply voltage, which may be above the programmed threshold voltage of the EPROM memory element to be read. The magnitude of the control gate voltage is then reduced to a value below the supply voltage and the programmed threshold voltage. In essence, a capacitive pre-charge (overcharge) and discharge are performed, and then the memory element is read. The difference in the two voltages, i.e., $\Delta V$, is small, and the current drawn is small as well. Indeed, this method does not draw any DC current.

By way of example, a row containing a memory element to be read is driven all the way to the maximum level of $V_{DD}$ (e.g., 7 v) in one clock period, and then a clamp circuit as part of the source control is used to clamp the voltage back to a predetermined level below $V_{DD}$ (e.g., 4.5 v) in the next clock period. The cell is then read in that next clock period. A current path is established through the memory element, and a sense amplifier detects the current therethrough, which may be very small, to determine the status and data content of the element.

This implementation also solves the high speed requirements by pre-charging the row voltage so it is not in the speed limiting path. In a classic EPROM architecture, the EPROM is made ready to be read by initializing the sense amplifier. Then, the row is turned on which propagates the enable voltage to the memory element. The memory cell is then turned on and the bit is read. This method involves making the row decoder (X decoder) drive very fast.

When scaling the memory element and adding the voltage regulator necessary to achieve an adequate control gate voltage, the resulting time required to read the memory element while consuming low current is very long in a classic implementation. The present invention uses a switched source as the high speed portion of the circuit. The row is driven all the way to $V_{DD}$ in one clock period, the clamp is turned on in the next period, and finally the source is turned on to read the cell. The actual speed path in this architecture is only the time required to turn on the source plus the time required to trip the sense amplifier. By driving the control gate voltage during the state of the microcontroller in which the EPROM is not being read, considerable time is saved. This method is not applicable in a high speed asynchronous stand-alone memory design.

BRIEF DESCRIPTION OF THE DRAWINGS

The above and still further aims, objects, features, aspects, and attendant advantages of the invention will become apparent from a consideration of the best mode presently contemplated for practicing the invention, as implemented in a preferred embodiment and method, taken in conjunction with the accompanying drawings, in which.

DETAILED DESCRIPTION OF THE PREFERRED EMBODIMENT AND METHOD

Figure 1:
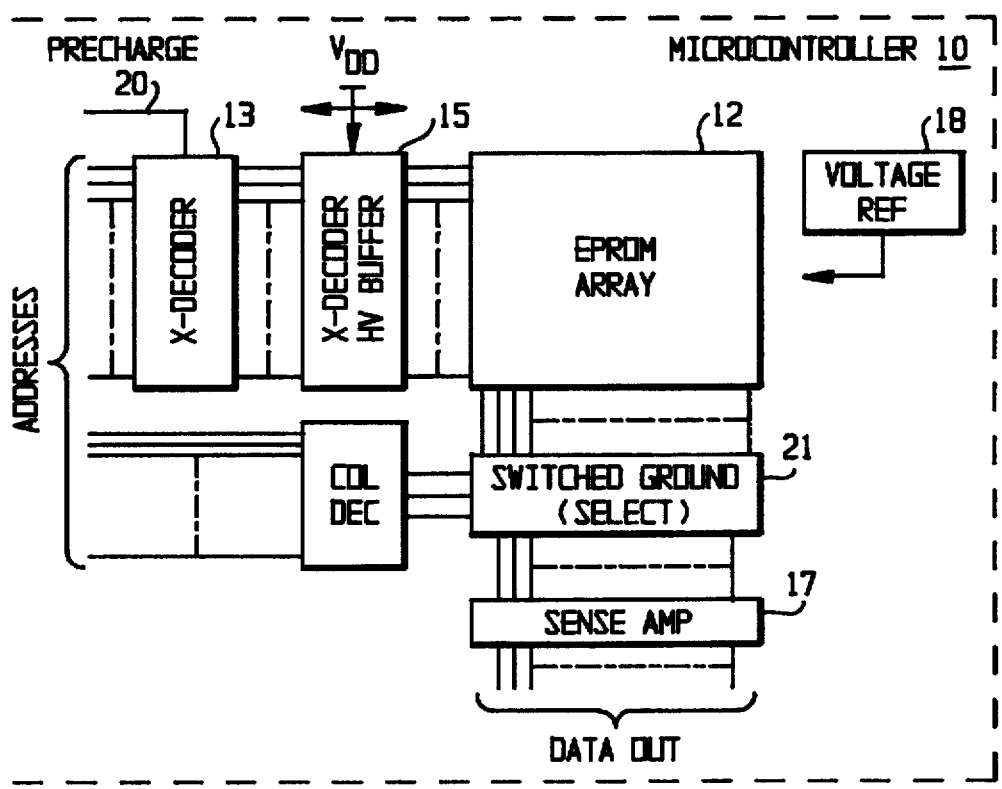
FIG. 1 is a circuit diagram of an exemplary EPROM array circuit embedded in a microcontroller device, in which the present invention is used.

An example of an applicable portion of an EPROM device embedded in a microcontroller in which the present invention is embodied is illustrated in the circuit diagram of FIG. 1. Portions of the circuit of particular interest include an X-decoder 13, X-decoder high voltage level shifting complementary metal-oxide-silicon (CMOS) buffer 15, voltage reference 18, row precharge 20, row clamp, sense amplifier 17, switched ground 21, all associated with the EPROM device.

An EPROM array 12 is embedded as a program memory in a microcontroller 10. The memory array is composed of the usual rows and columns in which the state of a transistor (i.e., presence or absence of a device) at the intersection of any given row and column represents the value ("0" or "1") of the bit stored at that array location. The standard supply voltage $V_{DD}$ of the microcontroller is used to control the EPROM memory element so as to read the data stored in the memory element. X-decoder 13, which is essentially the row driver circuit for EPROM array 12, generates the control gate voltage and the control programming voltage for the array. X-decoder high voltage level shifting CMOS buffer 15 is coupled to the supply voltage $V_{DD}$ to translate that voltage to a high voltage to program the EPROM memory element, and is also used in conjunction with sense amplifier 17 for the array.

Voltage reference 18 is used to limit the read voltage of the control gate and the drain of the memory element. A row precharge circuit is typically used with an EPROM to improve the time in which array locations are accessed to read data, or to reduce DC power dissipation, or both. Here, the row precharge 20 is done in the regulator circuit and is passed on to X-decoder 13 to drive the control gate. Sense amplifier 17 senses the current in the memory element, and determines the threshold of the EPROM element.

A switched ground circuit 21 is used to further speed up the access time of the EPROM array. The circuit is premised on current flow in the memory element only if the control gate of the element is high, the drain of the element is connected to the sense amplifier, and the source of the element is grounded. During setup of the row voltage, the source is disconnected from ground until the voltage has reached a predetermined proper value. At that point, the source is grounded and current flows to read the memory element.

Figure 2:
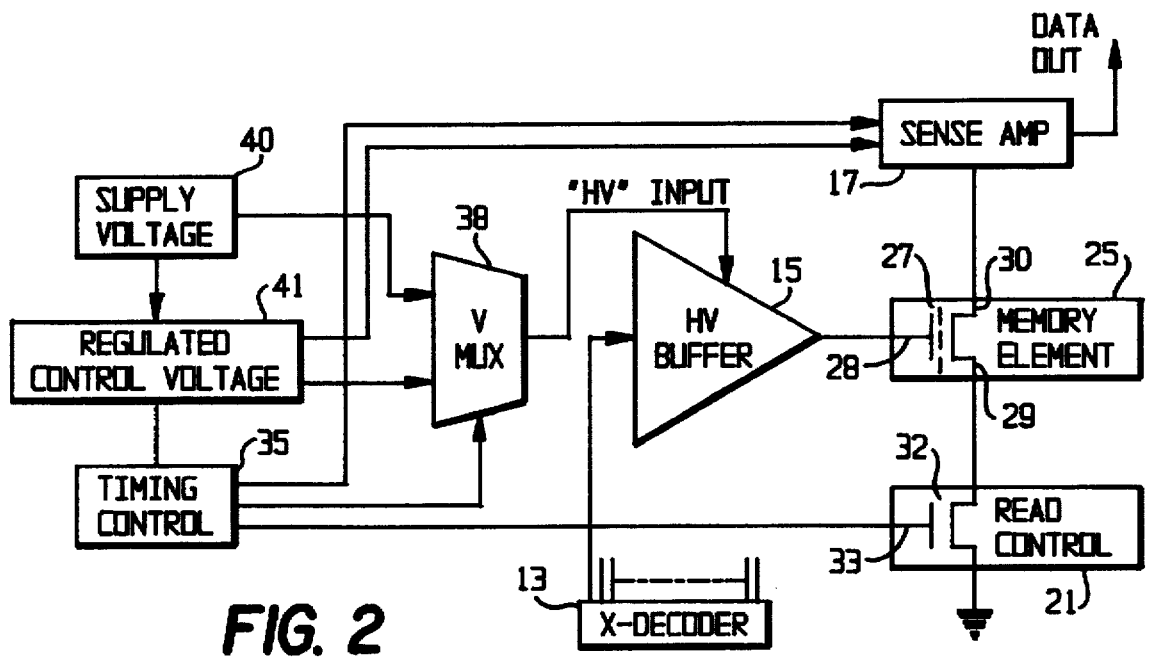
FIG. 2 is a circuit diagram illustrating a preferred embodiment and method of an overcharge/discharge voltage regulator in a read circuit for an EPROM memory element according to the invention.

In the circuit diagram of FIG. 2, memory element 25 of the array 12 comprises an MOS transistor 27 having a control gate 28, a source electrode 29, and a drain electrode 30. The drain electrode is connected to sense amplifier 17 which provides the data output from a read of the memory element 25. Initially, the control gate 33 of a switching transistor 32 in a read control circuit constituting a switched ground circuit 21 receives a control gate voltage during a first clock period from a timing control circuit 35 to which gate 33 is coupled. The level of the control gate voltage is predetermined to switch transistor 32 off, thereby disconnecting source electrode 29 of transistor 27 from ground.

During that first clock period, the timing control 35 delivers a signal to a voltage multiplexer (VMUX) 38, which receives dual inputs from the standard supply voltage 40 (i.e., $V_{DD}$) and a regulated control voltage 41, to connect the supply voltage to the control gate 28 of memory element 25. The output of VMUX 38 is coupled as a high voltage input to buffer 15, and the output of the buffer is applied to control gate 28. As a consequence, the effective capacitance associated with the row location of memory element 25 is quickly pre-charged to a level substantially equal to the supply voltage, which may be above the programmed threshold of the memory element. Timing control 35 then delivers a switching signal to VMUX 38 to remove the supply voltage from the control gate of memory element 25 and replace it with the lower regulated control voltage 41, so that the row control voltage of the memory element is discharged to a value lower than the EPROM programmed threshold voltage. This capacitive overcharge/discharge technique allows for very fast voltage stabilization at an analog voltage less than the supply voltage, without requiring significant mounts of current to achieve this result.

The timing control then switches on transistor 32 of switched ground circuit 21 by application of an appropriate voltage to its control gate 33 during the very next clock period. As a result, source electrode 29 of transistor 27 is now connected to ground so that current flows through the source-drain path of memory element 25, to enable the element to be read. To that end, the timing control activates sense amp 17 to provide a data readout.

Figure 3:
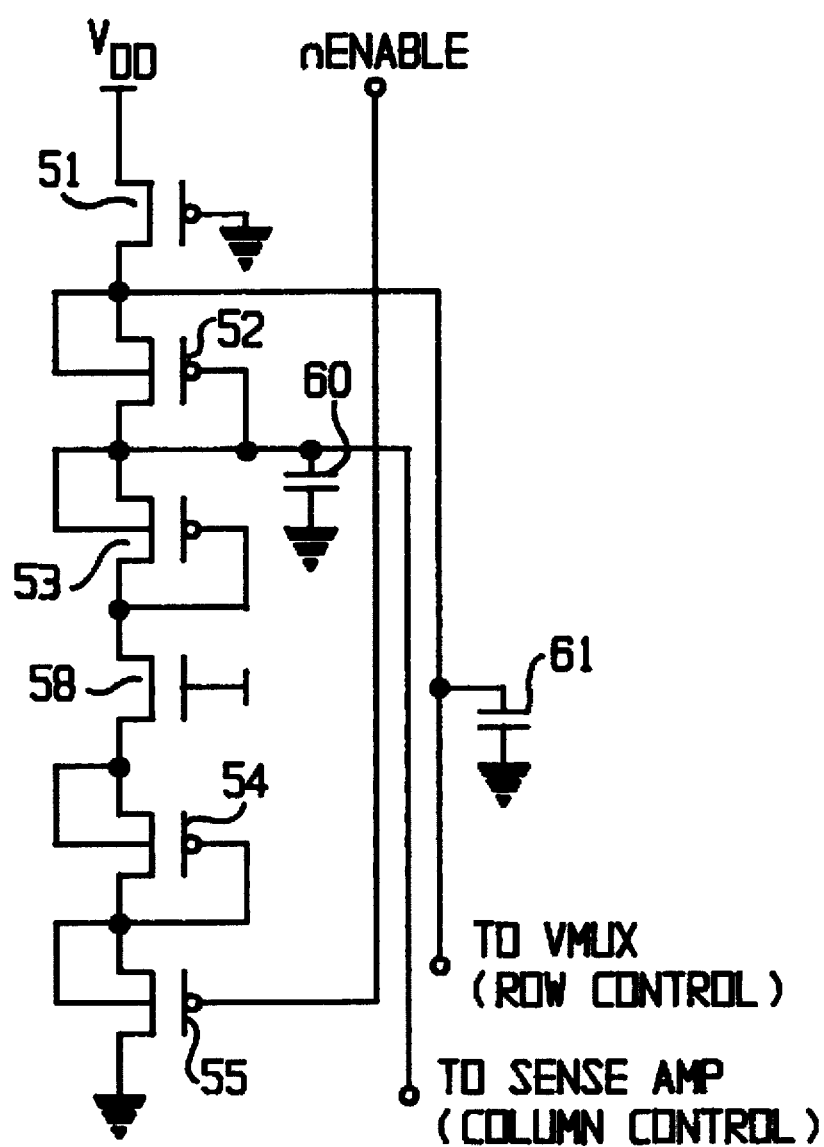
FIG. 3 is an exemplary embodiment of a regulated voltage reference generator used in the circuit of FIG. 2.

An exemplary embodiment of the regulated reference voltage source 41 is illustrated in FIG. 3. Source 41 comprises a plurality of PMOS transistors 51, 52, 53, 54, and 55, and an NMOS transistor 58. Transistor 51 is selected to have a current carrying capability significantly lower than that of the other transistors, so that as $V_{DD}$ rises, the voltage at the drain electrode of transistor 51 ultimately reaches a level which is sufficient to turn on all of the other transistors. The voltage at that node becomes a constant, regardless of an increasing magnitude of $V_{DD}$ above that level. The circuit generates low variance analog levels without the presence of switching circuits that could draw DC current of significant magnitude. Capacitors 60 and 61 are used to stabilize the analog voltages.

The output $V_{REF}$ of source 41 tracks the supply voltage $V_{DD}$ at low voltage levels during operation in the low voltage (non-programming) mode. And when $V_{DD}$ reaches the predetermined voltage level at which transistor 51 is turned on, which is less than the highest magnitude of $V_{DD}$, $V_{REF}$ is clamped at that voltage level. After the clamp voltage is set, the voltage applied to VMUX 38 for row control is slightly above the clamp voltage, and the voltage applied to the sense amplifier 17 for column control is slightly below the clamp voltage, by virtue of the different electrical connections of the row control and column control output paths to the transistor string of the circuit of FIG. 3. As $V_{DD}$ continues to rise to its full voltage, the voltages applied to the VMUX and the sense amplifier remain constant at thresholds respectively above and below the clamp voltage level. In essence, the clamp circuit controls $V_{REF}$ to track the supply voltage at levels below the predetermined clamp voltage level, and to remain at the clamp voltage level despite subsequent increases in the supply voltage above that level.

The use of scaled process technology to implement the EPROM memory causes the memory to support only very low current levels, generated by the voltage reference circuit. The X-decoder draws considerable current to drive a row of the array, even more at high speed than at relatively slower speed operation, and these higher current levels must be compensated for in the circuit, such as by generating an appropriate level of DC current at the voltage reference. Because this adversely affects product functionality, it is desirable instead to allow high speed operation without drawing DC current. To that end, in the circuit of FIG. 2 as described above, the row of interest in the EPROM array is pre-charged by driving—actually, overcharging—an effective capacitance up to the level of $V_{DD}$ for one clock period. Then the capacitance is discharged slightly to a preselected voltage which is at least slightly below the supply voltage level, and a clamp circuit in the voltage reference source is activated to clamp that lower voltage during the next clock period. The memory cell of that row, which has a relatively low threshold, is then read by connecting the source electrode of its transistor to ground to allow current to flow in the next clock period. Reading of the accessed cell is performed at high speed since the ground plane of the entire memory array is connected to the cell via the switched ground circuit.

The difference, $\Delta V$, between the supply voltage and reference voltage levels during this operation is relatively small, and consequently very little current is drawn. This is in contrast to prior art low speed designs in which a traditional DC reference draws DC current at all times. In the circuit of FIG. 2, an AC dynamic current is present, but the EPROM device operates at considerably higher speed, much higher current can be drawn, and the average current level is small. The sense amplifier for the column decoder performs tracking with a very low current (e.g., 500 nanoamps) requirement so that a low threshold, depletion mode transistor may be read at its threshold voltage.

Substantially the same regulated reference voltage level supplied to the X-decoder is applied to the Y-decoder of the circuit to limit the column voltage. Thus, both row and column voltages are set for operation according to the device implementation. Everything in this portion of the circuit is pre-charged and turned on except for ground (i.e., the switched ground circuit is off), and all voltages are brought up to full scale.

The circuit design accommodates reading the memory element at very low threshold voltage without drawing substantial current in the sense amp. In contrast, for example, a comparator-type amplifier suffers a current penalty. While the invention arose from design considerations of shrinking a current product in contemplation of a scaling of the process technology, the invention is not limited to such considerations.

Although a presently contemplated best mode of practicing the invention has been described herein, it will be understood by those skilled in the art to which the invention pertains, from a consideration of the foregoing description, that variations and modifications of the preferred embodiment and method of the invention may be made without departing from the true spirit and scope of the invention. Accordingly, it is intended that the invention shall be limited only to the extent required by the appended claims and the rules and principles of the applicable case law.

What is claimed is:

1. A microcontroller device fabricated on an integrated circuit chip with an embedded EPROM array, the microcontroller having a maximum supply voltage, said array comprising rows and columns of addressable memory elements each of which may be programmed at a threshold voltage level and selectively read to determine the data content thereof and each comprising a transistor having gate, source and drain electrodes, said device comprising:

means for applying a row control voltage at or substantially at the maximum level of the microcontroller supply voltage to the gate electrode of a preselected memory element to be read, which may exceed the programmed threshold voltage of the preselected memory element, to capacitively overcharge the row control voltage to substantially the maximum level of said supply voltage;

means for thereupon capacitively discharging said row control voltage for reduction thereof to a predetermined level below the maximum level of said supply voltage, whereby to quickly stabilize the row control voltage without significant current dissipation; and means for reading the data content of the preselected memory element while said row control voltage is at the reduced predetermined level by establishing a circuit path to cause current flow through the source-drain path of the transistor.

2. The microcontroller device of claim 1, wherein the means for reading data content of the preselected memory element includes means for connecting the source-drain path of the transistor to an electrical reference potential from a condition in which the respective memory element is electrically floating.

3. The device of claim 2, further including means for applying said row control voltage at substantially the maximum level of said supply voltage in a first clock period, means for discharging said row control voltage to the reduced predetermined level in the next clock period, and means for reading the preselected memory element in said next clock period.

4. A method for high speed reading of data from an erasable programmable read-only memory (EPROM) having a memory array which is programmed based on device status at intersections of rows and columns of the array to store data therein as 0's and 1's, the method comprising the steps of:

quickly overdriving a row of the array having an associated effective capacitance by overcharging thereof to substantially the maximum level of a supply voltage of the EPROM in one clock cycle, said maximum level exceeding the programming threshold voltage of a selected memory element of said row to be read, thereupon discharging the effective capacitance to a predetermined voltage level below said maximum level of the supply voltage in the next clock cycle, and then reading the status and data content of the selected memory element.

5. The method of claim 4, wherein the step of reading the data content of said selected memory element is performed by grounding an electrode of a source-drain path of a transistor comprising said memory element to cause current with substantially no DC component to flow through said path of the transistor.

6. The method of claim 5, further including the step of:

triggering a sense amplifier in the source-drain path of said transistor to detect current flow therethrough as indicative of the data content of said memory element.

7. The method of claim 6, wherein the voltage levels used for overdriving and discharging are applied to a control gate electrode of said transistor.

8. A high speed erasable programmable read-only memory (EPROM) having a memory array in which data is stored by programming memory elements at intersections of rows and columns of the array, said EPROM comprising:

means for capacitively overcharging a row of the array containing a memory element to be read to a voltage corresponding to substantially the maximum level of the supply voltage of the EPROM, possibly exceeding the programmed threshold voltage of said memory element to be read, means for rapidly discharging said row voltage to a predetermined level below said maximum level of the supply voltage, and means for thereupon reading said memory element by passing a current therethrough.

9. The memory of claim 8, further including means for timing the overdriving, discharging, and reading to occur in consecutive clock cycles of the EPROM.

* * * * *